(12) United States Patent
Brown et al.

(10) Patent No.: US 7,047,462 B2
(45) Date of Patent: May 16, 2006

(54) METHOD AND APPARATUS FOR PROVIDING JTAG FUNCTIONALITY IN A REMOTE SERVER MANAGEMENT CONTROLLER

(75) Inventors: Andrew Brown, Houston, TX (US); Theodore F. Emerson, Houston, TX (US); Michael Garrett, Cypress, TX (US); David Heinrich, Tomball, TX (US)

(73) Assignee: Hewlett-Packard Development Company, LP., Houston, TX (US)

( * ) Notice: Subject to any disclaimer, the term of this patent is extended or adjusted under 35 U.S.C. 154(b) by 481 days.

(21) Appl. No.: 10/037,541

(22) Filed: Jan. 4, 2002

(65) Prior Publication Data

US 2003/0140291 A1 Jul. 24, 2003

(51) Int. Cl.
*G01R 31/28* (2006.01)

(52) U.S. Cl. .......................................... 714/724; 714/30

(58) Field of Classification Search ................ 714/724, 714/31, 38; 710/100; 395/183.06, 183
See application file for complete search history.

(56) References Cited

U.S. PATENT DOCUMENTS

| 5,544,309 | A | * | 8/1996 | Chang et al. ................. 714/30 |
| 5,790,895 | A | | 8/1998 | Krontz et al. ................ 395/884 |
| 5,898,861 | A | | 4/1999 | Emerson et al. ............. 395/500 |
| 6,000,040 | A | * | 12/1999 | Culley et al. ................. 714/31 |
| 6,065,078 | A | * | 5/2000 | Falik et al. .................. 710/100 |
| 6,070,253 | A | * | 5/2000 | Tavallaei et al. .............. 714/31 |
| 6,484,274 | B1 | * | 11/2002 | Lee et al. ..................... 714/38 |
| 6,499,113 | B1 | * | 12/2002 | Tobin et al. .................. 714/19 |
| 6,578,167 | B1 | * | 6/2003 | Boorom et al. ............. 714/727 |
| 6,598,193 | B1 | * | 7/2003 | Li et al. ..................... 714/727 |
| 6,732,301 | B1 | | 5/2004 | Landry et al. |

OTHER PUBLICATIONS

Emerson et al., "Operating System Independent Method and Apparatus for Graphical Remote Access," U.S. Appl. No.: 09/438,253, filed Nov. 12, 1999.
Frantz et al., "USB Virtual Devices," U.S. Appl. No.: 09/544,573, filed Apr 6, 2000.
Emerson et al., "Video Eavesdropping and Reverse Assembly to Transmit Video Action to a Remote Console," U.S. Appl. No.: 08/733,254, filed Oct. 18, 1996.
"Compaq Remote System Management for Industry-Standard Servers," Compaq Computer Corporation Technology Brief, Sep. 2001.
"Remote Server Management with Integrated Remote Console," Compaq Computer Corporation Technology Brief, Oct. 21, 1996.

* cited by examiner

*Primary Examiner*—Albert DeCady
*Assistant Examiner*—John P. Trimmings

(57) ABSTRACT

The disclosed embodiments relate to the field of remote server management. More particularly, the embodiments relate to providing an embedded JTAG master in a remote server management controller. In an exemplary embodiment, the JTAG master is adapted to perform command and control functions on a wide range of integrated circuit components within a managed server. The JTAG master may also be configured to provide communication according to the In-Target Probe (ITP) and In-Circuit Emulation (ICE) test methodologies.

22 Claims, 4 Drawing Sheets

METHOD AND APPARATUS FOR PROVIDING JTAG FUNCTIONALITY IN A REMOTE SERVER MANAGEMENT CONTROLLER

BACKGROUND OF THE INVENTION

1. Field of the Invention

This invention relates generally to remote server management in networked computer systems and, more particularly, to improving the capability of remote server management by providing JTAG functionality in a remote server management controller.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

1. Introduction

Since the introduction of the first personal computer ("PC") over 20 years ago, technological advances to make PCs more useful have continued at an amazing rate. Microprocessors that control PCs have become faster and faster, with operational speeds eclipsing a gigahertz (one billion operations per second) and continuing well beyond.

Productivity has also increased tremendously because of the explosion in the development of software applications. In the early days of the PC, people who could write their own programs were practically the only ones who could make productive use of their computers. Today, there are thousands and thousands of software applications ranging from games to word processors and from voice recognition to web browsers.

As integrated circuits and other computer components such as motherboards have become more and more complex, effective and powerful methods to test them have become necessary. Accurate, thorough testing of integrated circuits and circuit boards in the early stages of their manufacture is very important for controlling manufacturing costs and ensuring product quality. If a defective integrated circuit or board is caught early in the manufacturing process, it may be pulled from further expensive processing for repair or scrap without wasting additional time and expense to produce a finished product that would just turn out to be defective in the end.

2. The Development of JTAG

In the mid-1980s, the Joint Test Action Group of the Institute of Electrical and Electronics Engineers ("IEEE") promulgated an industry standard known as IEEE 1149.1, which was entitled "Test Access Port and Boundary-Scan Architecture." That specification came to be known by the acronym "JTAG." The JTAG standard sets out a methodology for performing testing on complex integrated circuits and circuit boards. JTAG provides a strategy to assure the integrity of individual components and the interconnections between them after installation on a printed circuit board ("PCB"). Since it was first promulgated, the JTAG standard has become widely adopted.

As integrated circuits contain more and more functionality, the packages that contain them ("chips") continue to get bigger and bigger. Modern integrated circuits have dozens of electrical inputs and outputs called "pins." To thoroughly test these chips, power may be applied and the input pins may be connected to equipment that can provide input signals ("test vectors"). Typically, a device known as a "test bed" or "interposer" is constructed to physically connect the power, input and output signals of the chip to the correct parts of a tester. If the device is functioning properly, the output pins, which are also connected via the test bed or interposer to equipment that can read their response to the test vectors, will respond in a predictable way. If the output pins do not respond correctly to the test vectors, the device fails and is normally removed from further processing until the root cause of the failure can be determined.

The more pins an integrated circuit has, the more closely (densely) packed together those pins have to be in the chip package. Increasing pin density is an ongoing problem for engineers and technicians who design and build integrated circuits. High pins density means that the pins are closer together, which makes it harder to design test beds and interposers to connect to the pins of a chip without shorting them to other pins that are close by.

The JTAG testing standard attempts to improve these physical access problems caused by high pin density by eliminating the need to connect individual chips being tested to an external connector, such as a test bed or interposer. Instead, each JTAG-compatible integrated circuit has test functionality built directly into its internal workings. After a circuit board is assembled, the test equipment connects to a single connector on the circuit board rather than each of the individual chips on the board.

The JTAG architecture may be envisioned as a large scan chain, in which the JTAG-compatible chips on a circuit board are all connected in series (like a chain) that is accessible through the test connector on the circuit board. Information from each device in the chain is sequentially made available at the test connector. Thus, information from each device may be shifted from device to device around the scan chain. As the tester works its way around the chain, the output of each device in the chain may be examined and evaluated. To verify the operation of the components in the chain, components may be instructed (via test vectors) to load signals, sample signals, bypass components, program or alter any device registers that are accessible through the JTAG chain.

In addition to facilitating the testing of components, JTAG device access may also be used to debug and configure integrated circuits after installation on a circuit board. JTAG devices may be designed to have their own set of user-defined instructions, such as CONFIGURE and VERIFY, which are accessible through a JTAG interface. User-defined characteristics may be used to control a wide variety of operational parameters of the device and to perform failure analysis after a device failure occurs.

Modern microprocessors and chipsets support JTAG and are good examples of devices that allow access and control of many internal functions through an on-board JTAG Interface. In fact, Intel Corporation, a major manufacturer of microprocessors and chipsets, has adopted the JTAG architecture as part of its In-Target Probe ("ITP") and In-Circuit Emulation ("ICE") test methodologies. ITP and ICE employ standard JTAG signals, plus a few others. The ITP and ICE methodologies are widely used to troubleshoot and configure microprocessors, chipsets and other chips.

In addition to its support of device testing, debugging and configuring, JTAG may be used to program and reprogram a wide range of memory devices such as flash memory, PROMs, CPLDs and FPGAs. Programming and reprogramming of these devices may be done via the JTAG interface after the devices are installed on a circuit board such as a system motherboard.

3. The Growth of Computer Networking and Remote Server Management

In addition to improvements in PC hardware, software and component testing, the technology for making computers more useful by allowing users to connect PCs together and share resources between them has also seen rapid growth in recent years. This technology is generally referred to as "networking." In a networked computing environment, PCs belonging to many users are connected together so that they may communicate with each other. In this way, users can share access to each other's files and other resources, such as printers. Networked computing also allows users to share internet connections, resulting in significant cost savings. Networked computing has revolutionized the way in which business is conducted across the world.

Not surprisingly, the evolution of networked computing has presented technologists with some challenging obstacles along the way. One obstacle is connecting computers that use different operating systems ("OSes") and making them communicate efficiently with each other. Each different OS (or even variations of the same OS from the same company) has its own idiosyncrasies of operation and configuration. The interconnection of computers running different OSes presents significant ongoing issues that make day-to-day management of a computer network challenging.

Another significant challenge presented by the evolution of computer networking is the sheer scope of modern computer networks. At one end of the spectrum, a small business or home network may include a few client computers connected to a common server, which may provide a shared printer and/or a shared internet connection. On the other end of the spectrum, a global company's network environment may require interconnection of hundreds or even thousands of computers across large buildings, a campus environment, or even between groups of computers in different cities and countries. Such a configuration would typically include a large number of servers, each connected to numerous client computers.

Further, the arrangements of servers and clients in a larger network environment could be connected in any of a large number of topologies that may include local area networks ("LANs"), wide area networks ("WANs") and municipal area networks ("MANs"). In these larger networks, a problem with any one server computer (for example, a failed hard drive, failed network interface card or OS lock-up to name just a few) has the potential to interrupt the work of a large number of workers who depend on network resources to get their jobs done efficiently. Needless to say, companies devote a lot of time and effort to keeping their networks operating trouble-free to maximize productivity.

An important aspect of efficiently managing a large computer network is to maximize the amount of analysis and repair that can be performed remotely (for example, from a centralized administration site). Tools that facilitate remotely analyzing and servicing server problems help to control network management costs by reducing the number of network management personnel required to maintain a network in good working order. Remote server management also makes network management more efficient by reducing the delay and expense of analyzing and repairing network problems. Using remote management tools, a member of the network management team may identify problems and, in some cases, solve those problems without the delay and expense that accompanies an on-site service call to a distant location.

Remote management tools can communicate with a managed server using either (1) in-band communication or (2) out-of-band communication. In-band communication refers to communicating with the server over a standard network connection such as the managed server's normal Ethernet connection. In-band communication with the server is, accordingly, only possible when the server is able to communicate over its normal network connection. Practically speaking, this limitation restricts in-band communication to times when the OS of the managed server is operational (online).

Out-of-band communication, which is not performed across the managed server's normal connection to the network, is a much more powerful tool for server management. In out-of-band communication, a "back door" communication channel is established by a remote server management tool (such as a remote console or terminal emulator) using some other interface with the server (such as (1) through the server's modem, (2) via a direct connection to a serial port, (3) through an infrared communication port, or (4) through a management Ethernet interface or the like).

In a sense, out-of-band communication is like opening an unobtrusive window through which the inner workings of the operation of the managed server may be observed. After the out-of-band communication link with the server is established, the remote server management tool communicates with the server to obtain data that will be useful to analyze a problem or potential problem. After a problem has been analyzed, out-of-band communication may be possible to control the managed server to overcome the problem or potential problem.

In addition to the distinction between in-band and out-of-band communication with a managed server, another important distinction is whether the managed server is online or offline. The term "online" refers to a managed server in which the OS is up and running. The managed server is said to be "offline" if its OS is not up and running. For the purpose of explaining the present technique, communications with a managed server will take place in one of these four states: (1) in-band online; (2) in-band offline; (3) out-of-band online; and (4) out-of-band offline.

An important goal in the development of remote server management tools is to increase the number of server problems that may be analyzed and repaired remotely (that is, without requiring direct, on-site intervention by a member of the network management team). To facilitate that goal, it is highly desirable to have a network management tool that is able to capture the maximum amount of information from a managed server in the maximum range of operational states of the server (for example, not powered up, fully operational or powered but locked up) and to allow control of the managed server based on that data.

It is also highly desirable to have a remote management tool that is integrated within the managed server and capable of exercising the maximum amount of control over constituent devices within the managed server. The microprocessor and the chipset of the managed server are examples of devices that would be useful to access and control remotely.

Early remote management tools were able to analyze and address a relatively narrow range of managed server problems. One of the first remote server management tools had the ability to reset a managed server remotely by cycling power to turn the server off and on again via an out-of-band communication session over a phone line. In this way, a managed server could be reset whether in an online or offline condition. This tool, however, did not have the ability to assimilate data about the operation of the managed server or to analyze the cause of the managed server's failure. Accordingly, the principal utility of these early server management tools was to reset the managed server after catastrophic failure. These management tools were not useful for diagnosing subtle problems or preventing future failures.

Later server management tools employed proprietary software agents similar to device drivers to monitor a wide range of conditions in the managed server directly (for example, alerts and management parameters specified by the Simple Network Management Protocol ("SNMP")). The proprietary software agents in these management tools were designed to pass their data to the OS of the managed server, where it could be retrieved by remote access such as a remote management console application.

The large amount of data accessible by these management tools made them useful for diagnosing the cause of a wide range of server failures and permitting repair of those failures. A shortcoming of these server management tools, however, is that they rely primarily on communication between the managed server's OS and proprietary software agents that monitor conditions in the managed server. This limitation means that the tool is only operational when the managed server is online. Server management tools of this type are, accordingly, of little use in correcting problems in a managed server that is offline.

A still later generation of server management tools relied on a dedicated add-in card comprising an independent processor, memory, and battery backup. The add-in card essentially provided a dedicated management computer for monitoring and controlling the managed server. The dedicated management computer was hosted in the managed server and could communicate with the managed server (host) through an existing communication interface (for example, the PCI bus of the managed server). Such remote management tools could additionally include software agent-based data gathering capability of the type used in earlier agent-based systems previously discussed. In this way, these remote management solutions combine the advantages of deep information gathering capability (software agent-based information gathering technology available when the OS of the managed server is online) with the ability to control the operation of the managed server independently via an out-of-band communication session using the dedicated server management computer system hosted in the managed server.

The add-in card type of remote management tool could also include the capability to capture video data and reset sequences from the managed server for remote display or replay at a later time. The capture of video data is facilitated by the close integration of a remote management tool with the managed server and the ability of the remote management tool to communicate with the managed server over existing communication links (such as an industry standard PCI bus). The ability of a remote management tool to capture video data from a managed server is a particularly powerful analysis tool because it lets a remote user have "virtual access" to the managed server, just as if the user was physically present and inspecting the managed server in person.

In a typical remote management system employing a dedicated server management computer on an add-in card, a user (typically, a member of the network management team) could initiate an out-of-band session with the dedicated server management computer hosted in the managed server via a remote console application program being executed on a client computer. The dedicated management computer could be addressed by the user to control various aspects of the operation of the managed server via control circuitry connected to the embedded server management computer hosted by the managed server.

The present invention is directed to further improvements of remote server management technology.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
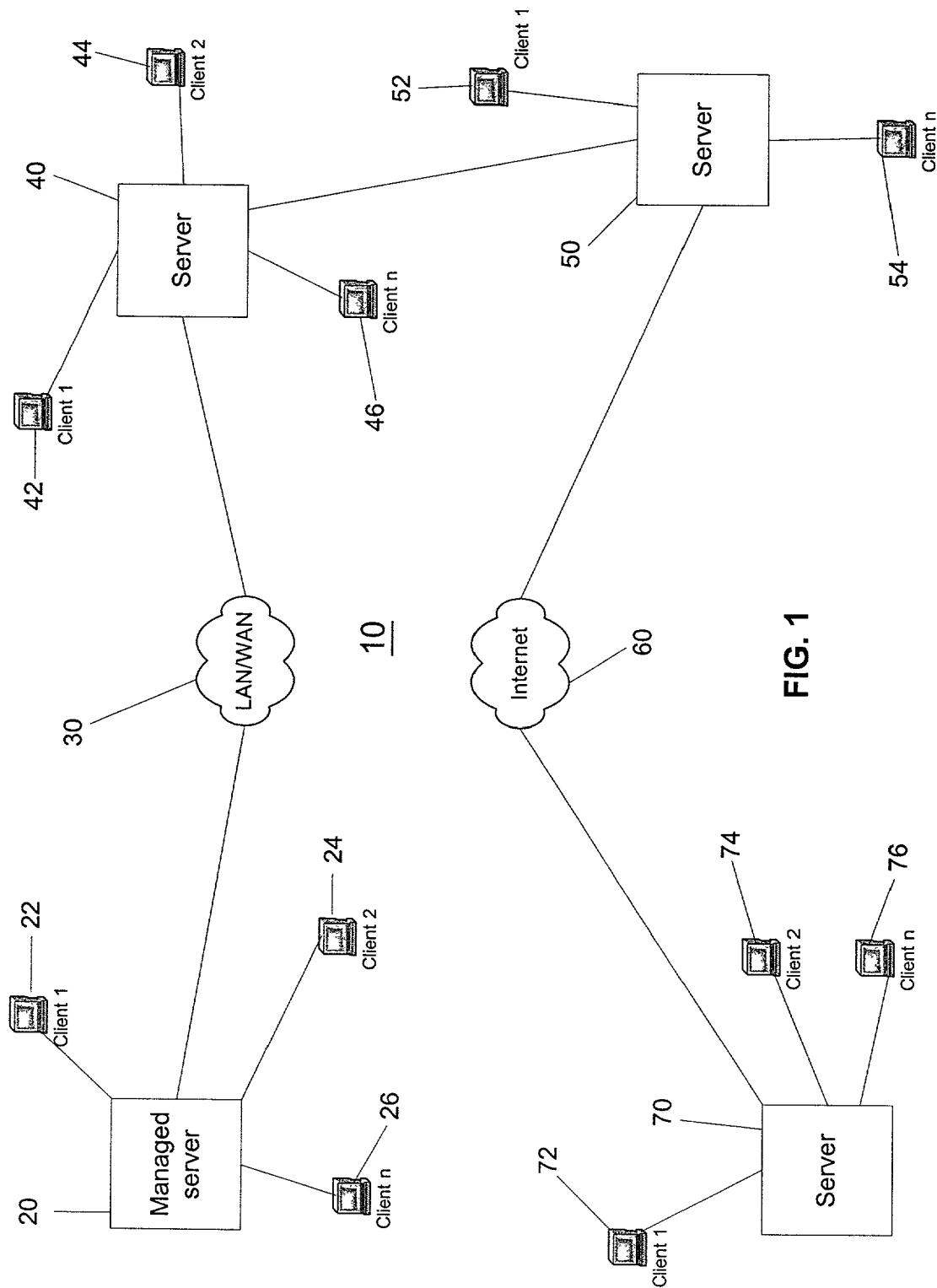
FIG. 1 is a block diagram illustrating an exemplary computer network system in which a remote server management controller of the present invention may be practiced.

Turning now to the drawings and referring initially to FIG. 1, a block diagram of an exemplary computer network system in which the present invention may be practiced is illustrated and designated using a reference numeral 10. The computer network 10 is intended to illustrate a typical modern computer network configuration with all its complexities and flexibility. A managed server 20 is connected to a plurality of client computers 22, 24 and 26. For purposes of explaining the present invention clearly, only one server on the network 10 has been designated as a "managed server." In practice, those of skill in the art will appreciate that the any or all of the servers in the network 10 could simultaneously include hardware and software devised according to the invention, making those servers "managed servers" as well.

The managed server 20 may be connected to as many as n different client computers. The magnitude of n is a function of the computing power of the managed server 20. If the managed server has large computing power (for example, faster processor(s) and/or more system memory) relative to other servers on the network, it will be able to effectively serve a relatively large number of client computers.

The managed server 20 is connected via a typical network infrastructure 30, which may consist of any combination of hubs, switches, routers and the like. While the network infrastructure 30 is illustrated as being either a local area network ("LAN") or wide area network ("WAN"), those skilled in the art will appreciate that the network infrastructure 30 may assume other forms such as a municipal area network ("MAN") or even the Internet.

The network infrastructure 30 connects the managed server 20 to server 40, which is representative of any other server in the network environment of managed server 20. The server 40 may be connected to a plurality of client computers 42, 44 and 46. The server 40 is additionally connected to server 50, which is in turn connected to client computers 52 and 54. The number of client computers connected to the servers 40 and 50 is dependent only on the computing power of the servers 40 and 50, respectively.

The server 40 is additionally connected to the Internet 60, which is in turn connected to a server 70. Server 70 is connected to a plurality of client computers 72, 74 and 76. As with the other servers shown in FIG. 1, server 70 may be connected to as many client computers as its computing power will allow.

Those skilled in the art will appreciate that neither the exact topology of the network illustrated in FIG. 1 nor the protocol of network communication (for example, Ethernet or any number of other common protocols) is a crucial aspect of the present invention. Moreover, the network topology shown in FIG. 1 is hypothetical and is shown only to explain the present invention with greater clarity by giving an example of a network environment in which the present invention is useful.

As explained in detail below, the present invention is illustrated as being deployed in a remote server management controller by way of example. The exemplary remote server management controller may be hosted in the managed server 20. The exemplary remote server management controller may be accessed via a remote console application program (or browser program) running on any of the client computers shown in FIG. 1.

For purposes of explaining the invention clearly, the remainder of this description is written with the assumption that the server 70 and clients 72, 74 and 76 are located in a remote administration site. The further assumption is made that a user (network administrator) located at the network administration site desires to use a remote console program running on one of the clients 72, 74 or 76 to establish a remote server management communication with the managed server 20. To accomplish this connection, the communication path between server 70 and managed server 20 must traverse the Internet 60, which is publicly accessible and prone to eavesdropping and snooping by hackers. After traversing the Internet 60, the communication path between the server 70 and the managed server 20 traverses servers 40, 50 and network infrastructure 30 in a typical manner before terminating at the managed server 20.

Figure 2:
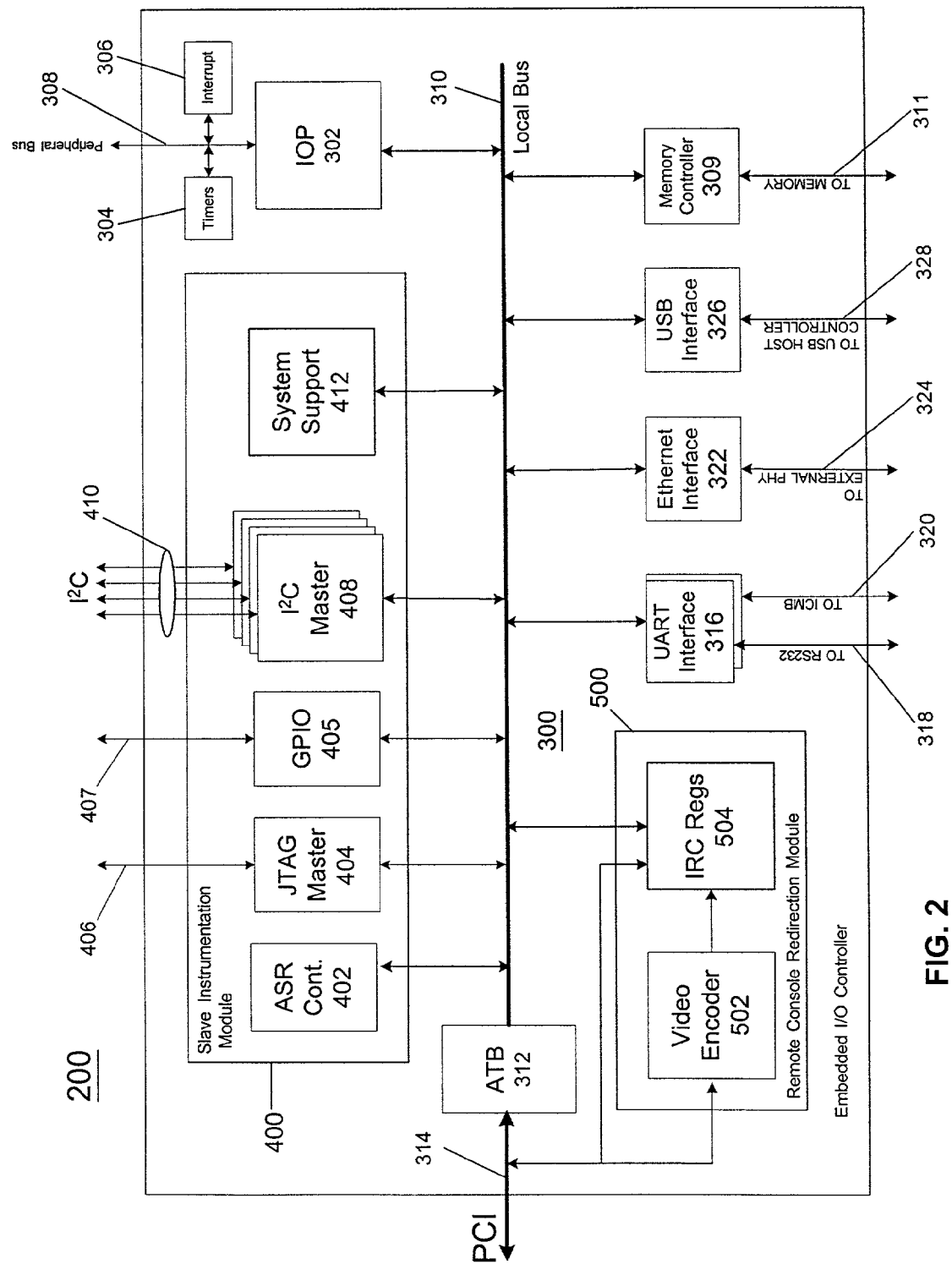
FIG. 2 is a functional block diagram of one embodiment of a remote server management controller constructed according to the present invention.

FIG. 2 shows a functional block diagram of one exemplary embodiment of a remote server management controller 200 constructed according to the present invention. The remote server management controller 200 may be implemented in a single application specific integrated circuit ("ASIC"). Alternatively, the remote server management controller 200 may be implemented in a plurality of integrated circuits or discrete components. Those skilled in the art will appreciate that implementation details such as deciding which functional aspects of remote server management controller 200 are implemented in a single ASIC or different ASICs are matters of design choice and not crucial aspects of the present invention.

The remote server management controller 200 may be implemented so that it is powered and capable of operation whether or not the managed server 20 (FIG. 1) is powered up (turned on) or online. Powering the remote server management controller 200 regardless of whether the host managed server is turned on allows the remote server management controller 200 to monitor, analyze and potentially intervene to correct the widest possible range of system problems that may befall the managed server 20 (FIG. 1).

The logic of the remote server management controller 200 is broken down into three main functional blocks. The first of these three functional blocks is an embedded I/O controller 300, which is essentially an independent computer system that is integrated within the managed server 20 (FIG. 1). The second and third functional blocks of the remote server management controller 200 are a slave instrumentation module 400 and a remote console redirection module 500. The embedded I/O controller 300 monitors and controls a wide range of conditions in the managed server 20 via the slave instrumentation module 400 and the remote console redirection module 500.

The embedded I/O controller 300 comprises an Input/Output processor ("IOP") 302, which provides general control and functions as a management processor for the remote server management controller 200. The IOP 302 may be implemented as a 32-bit RISC processor, but other processor implementations may be employed as well. The IOP 302 is operatively coupled to a timer module 304 and an interrupt controller 306 via a peripheral bus 308.

In one exemplary embodiment of the invention, a memory controller 309 is operatively coupled to the internal local bus 310. The memory controller 309 is, in turn, operatively coupled to dedicated memory via a memory interface 311. The dedicated memory may be battery-backed SRAM, SDRAM, ROM, NVRAM or any other appropriate type of memory.

The IOP 302 (located in the embedded I/O controller 300) is operatively coupled to the other functional modules (and many sub-modules) of the remote server management controller 200 via an internal local bus 310. Those of ordinary skill in the field will appreciate that the internal local bus 310 exists to allow communication between and among the logical components of the remote server management controller 200. The implementation details of the internal local bus 310 are a matter of design choice and not a crucial aspect of the present invention.

An address translation and bridging ("ATB") unit 312 is operatively coupled to the internal local bus 310 and to a PCI bus 314. PCI bus 314 is integral within and operatively coupled with the managed server 20 (FIG. 1). Preferably, the PCI bus 314, which serves as the main communication interface between the managed server 20 (FIG. 1) and the remote server management controller 200, may be configured as a 32-bit, 33 MHz PCI master/slave interface. In a typical system implementation, the remote server management controller 200 resides on the "compatibility" segment of PCI bus 314, but the PCI bus segment on which the remote server management controller is disposed is not a crucial aspect of the invention. The ATB unit 312 is also constructed to allow the remote server management controller 200 to decode bus cycles on the PCI bus 314 and to communicate over the PCI bus 314 by initiating PCI bus cycles.

The embedded I/O controller 300 provides a plurality of communication interfaces that can be employed to establish communication sessions with the remote server management controller 200. One such communication interface is a UART interface module 316, which is operatively coupled to internal local bus 310. The exemplary UART interface module 316 comprises two standard 16550 UARTs, each of which may provide a separate serial communication interface between the remote server management controller 200 and the external world. Both UARTs are mapped into the address space of the IOP 302 and can be accessed via PCI bus 314 or by the IOP 302. Either UART may be implemented so that it can be reset through a control register in the address space of the IOP 302.

Outputs from the UART interface module 316 are typically routed to transceivers (not shown), where they may be converted into a wide variety of serial interface types. Examples of the types of serial interfaces that may be provided by the UART interface module 316 are a standard RS-232 interface 318 or an interface that complies with the Intelligent Chassis Management Bus ("ICMB") specification promulgated by Intel Corporation (ICMB interface 320). Those of ordinary skill in the field will appreciate that the RS-232 interface 318 may be used to connect to a wide range of industry standard modems, terminal servers and the like.

Embedded I/O controller 300 further comprises an Ethernet interface 322, which is operatively coupled to the internal local bus 310. Ethernet interface 322 provides the main external communication interface between the remote server management controller 200 and the outside world. In the exemplary embodiment shown in FIG. 2, the integrated portion of the Ethernet interface 322 includes a MAC (Media Access Controller), inbound and outbound FIFOs, and a DMA engine to automatically transfer packets to and from memory. The Ethernet interface 322 requires a connection via interface 324 to an external PHY (not shown) and typical magnetic coupling to couple the PHY to the wire that serves as the transmission media.

Embedded I/O controller 300 further comprises a USB interface 326, which is operatively coupled to the internal local bus 310. The USB interface 326 is connected to a USB host controller (not shown) via a USB host controller interface 328. The USB interface 326 is connected to one port of a USB host controller, which is typically located in a south bridge portion of the chipset of the managed server 20 (FIG. 1). When implemented in this way, the IOP 302 of the remote server management controller 200 may establish "virtual USB peripherals" that will be seen and recognized by any USB-aware OS or properly adapted system BIOS. These virtual peripherals may be presented to any USB-aware OS to allow communication with the OS in a common, OS-independent manner.

The next major functional block of the remote server management controller 200 is the slave instrumentation module 400. The primary purpose of the slave instrumentation module 400 is to provide the hardware infrastructure to implement control and monitoring functions in the managed server 20 (FIG. 1). The slave instrumentation module 400 operates under the control of the IOP 302 in conjunction with dedicated application software such as remote console management software running on a client computer.

The slave instrumentation module 400 comprises an automatic server recovery ("ASR") controller 402, which operates to automatically respond to catastrophic failures of the managed server 20 (FIG. 1). The ASR controller 402 is operatively coupled to the internal local bus 310. The ASR controller 402 continually monitors whether the OS of the managed server 20 (FIG. 1) is operational by controlling a dead-man timer that requires periodic servicing by the OS. If the OS of the managed server 20 (FIG. 1) does not service the dead-man timer within a predetermined time, the ASR controller 402 resets the processor of the managed server 20 (FIG. 1) causing the managed server 20 (FIG. 1) to reboot.

A general purpose input/output module ("GPIO") 405 is provided in the exemplary embodiment of the slave instrumentation module 400. The GPIO provides a versatile communication interface that may be used for a wide variety of purposes.

The slave instrumentation module 400 also comprises a JTAG master 404. The JTAG master 404 is operatively coupled to the internal local bus 310. The JTAG master 404 comprises a JTAG interface 406, which is operatively coupled to another device disposed in the managed server 20 (FIG. 1). The JTAG interface 406 is adapted to communicate with a Test Access Port or "TAP" (terminology of the JTAG specification) in a device connected to the JTAG master 404. The TAP is a set of registers and protocols used to communicate according to the JTAG standard.

The JTAG master 404 provides powerful capability to control a wide range of aspects of the managed server 20 (FIG. 1) by providing an interface between the remote server management controller 200 and components of the managed server 20 (FIG. 1). The JTAG master 404 is accessible remotely by virtue of its incorporation into the remote server management controller 200.

Microprocessors and chipsets that are typically available from vendors such as Intel Corporation of Santa Clara, Calif., frequently provide JTAG interfaces that may be exploited by the remote server management controller 200 via the JTAG master 404. The JTAG master 404 may be connected to microprocessors and chipsets that support JTAG via the JTAG interface 406. Additionally, the JTAG interface 406 may include signals compatible with the In-Target Probe ("ITP") and In-Circuit Emulation ("ICE") test and control methodologies promulgated by Intel Corporation.

Furthermore, the JTAG interface 406 may be connected to other memory or logic devices such as flash memory, PROMs, CPLDs and FPGAs. The JTAG master 404 may reprogram these devices via the JTAG interface 406. For example, the BIOS of the managed server 20 (FIG. 1) may be reprogrammed provided that the memory device that stores the BIOS is JTAG-compatible and connected with the JTAG interface 406 or connected to another integrated circuit that is JTAG-compatible and operably connected with the JTAG interface 406.

The slave instrumentation module 400 further comprises an $I^2C$ master 408, which is operatively coupled with the internal local bus 310. The $I^2C$ master 408 has the capability of controlling a plurality of independent $I^2C$ serial channels 410. For purposes of example only, four (4) separate $I^2C$ channels are shown in FIG. 2. The $I^2C$ master 408 comprises a separate $I^2C$ engine for controlling each separate $I^2C$ channel.

The slave instrumentation module 400 additionally comprises a block of system support logic 412. The system support logic 412 is operatively coupled to the internal local bus 310. The system support logic 412 provides a variety of housekeeping functions for the managed server 20 (FIG. 1). Examples of these functions include providing the EISA bus ID, flash ROM support, ECC support, hot spare boot support, system post monitor support, floppy write protect, SMI base security measures, open hood detection and the like.

The remote console redirection module 500 may include a video encoder 502 and an IRC register 504. The video encoder may replicate video data for out-of-band communication with one of the client computers. Similarly, the IRC register 504 may replicate text changes, such as keystrokes, and communicate those text changes out-of-band to the one of the client computers.

Figure 3:
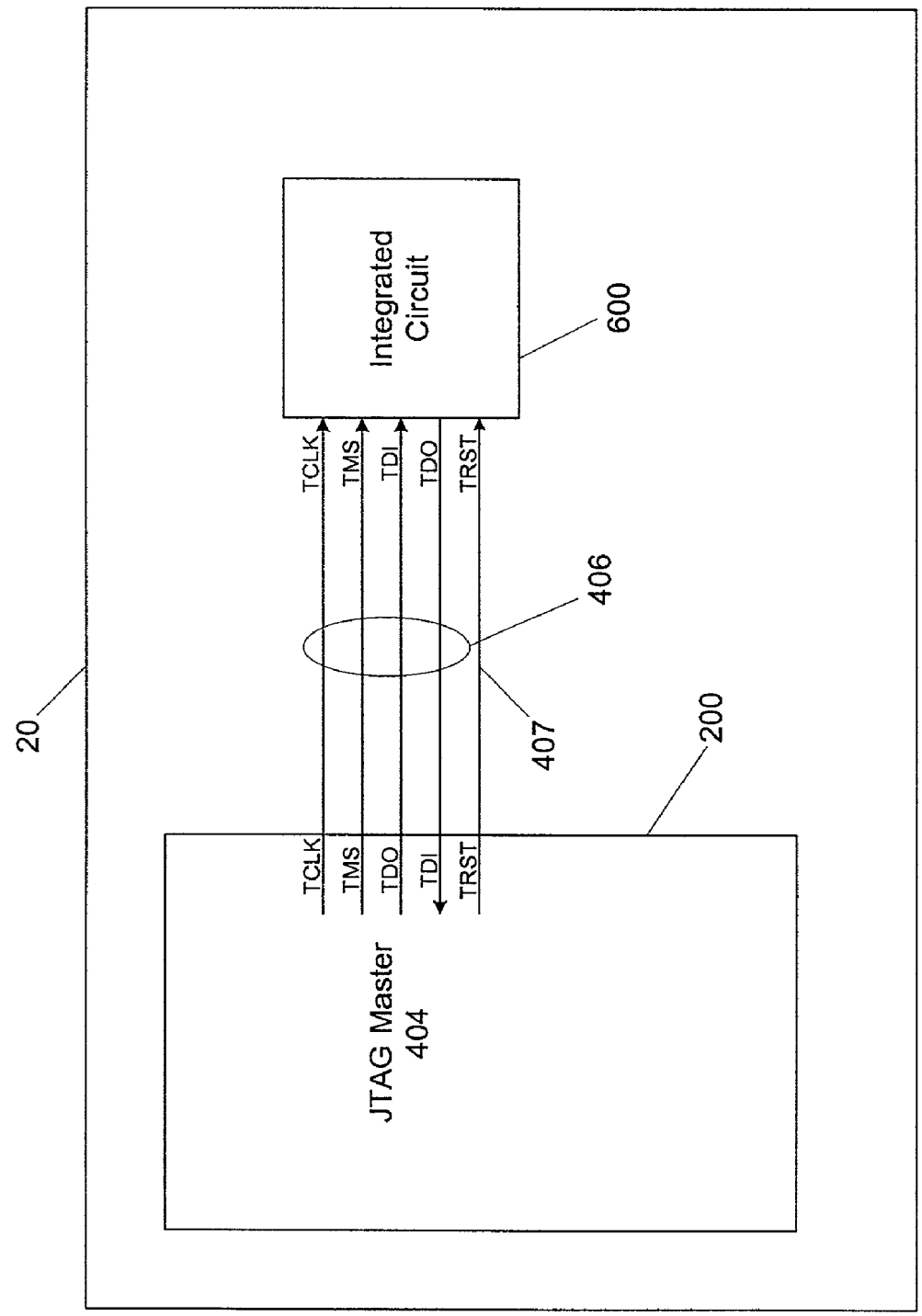
FIG. 3 is a schematic diagram of an exemplary embodiment of an embedded JTAG master as implemented in a managed server.

FIG. 3 is a schematic diagram of an exemplary embodiment of JTAG master 404 as deployed in the managed server 20 (FIG. 1). In the disclosed embodiment, the JTAG master 404 is a functional block of the remote management controller 200. The JTAG interface 406 is connected to an integrated circuit 600, which may be connected to a plurality of additional JTAG-compatible integrated circuits to form a JTAG scan chain. The JTAG interface 406 comprises the following four signals: TCLK, TMS, TDO and TDI. The exemplary embodiment also includes a test reset (TRST) signal 407, which resets the internal state machine of each device in the JTAG scan chain.

Those of ordinary skill in the field will appreciate that discussions of the operation of TDI and TDO will depend on the position of the device in the scan chain. For example, in a scan chain with only one slave device, the TDO signal from the JTAG master 404 is connected to the TDI pin of the device in the scan chain and vice versa. Connections for configurations may be determined on a case by case basis and are not a crucial aspect of the present invention. For purposes of simplicity, the following discussion refers to the perspective of the device being communicated with by the JTAG master 404 unless otherwise stated.

The integrated circuit 600 may be disposed on the motherboard or any other circuit board within the managed server 20. The integrated circuit 600 could be any of a wide range of devices including a processor, microprocessor, a component in a chipset, a flash memory, a PROM, a CPLD or an FPGA.

The JTAG interface 406 forms the interface between the JTAG master 404 and any device to which the JTAG master 404 is connected. In the exemplary embodiment, the JTAG interface 406 comprises four (4) signals required by the JTAG standard. Those four signals are set forth below in Table 1. TDI, TMS and TCK are input signals and TDO is an output signal.

TABLE 1

TAP Controller Signals

| Pin | Description |
|---|---|
| TDI | Test Data In Signal |
| TMS | Test Mode Select Signal |
| TCK | Test Clock Signal |
| TDO | Test Data Out Signal |

Figure 4:
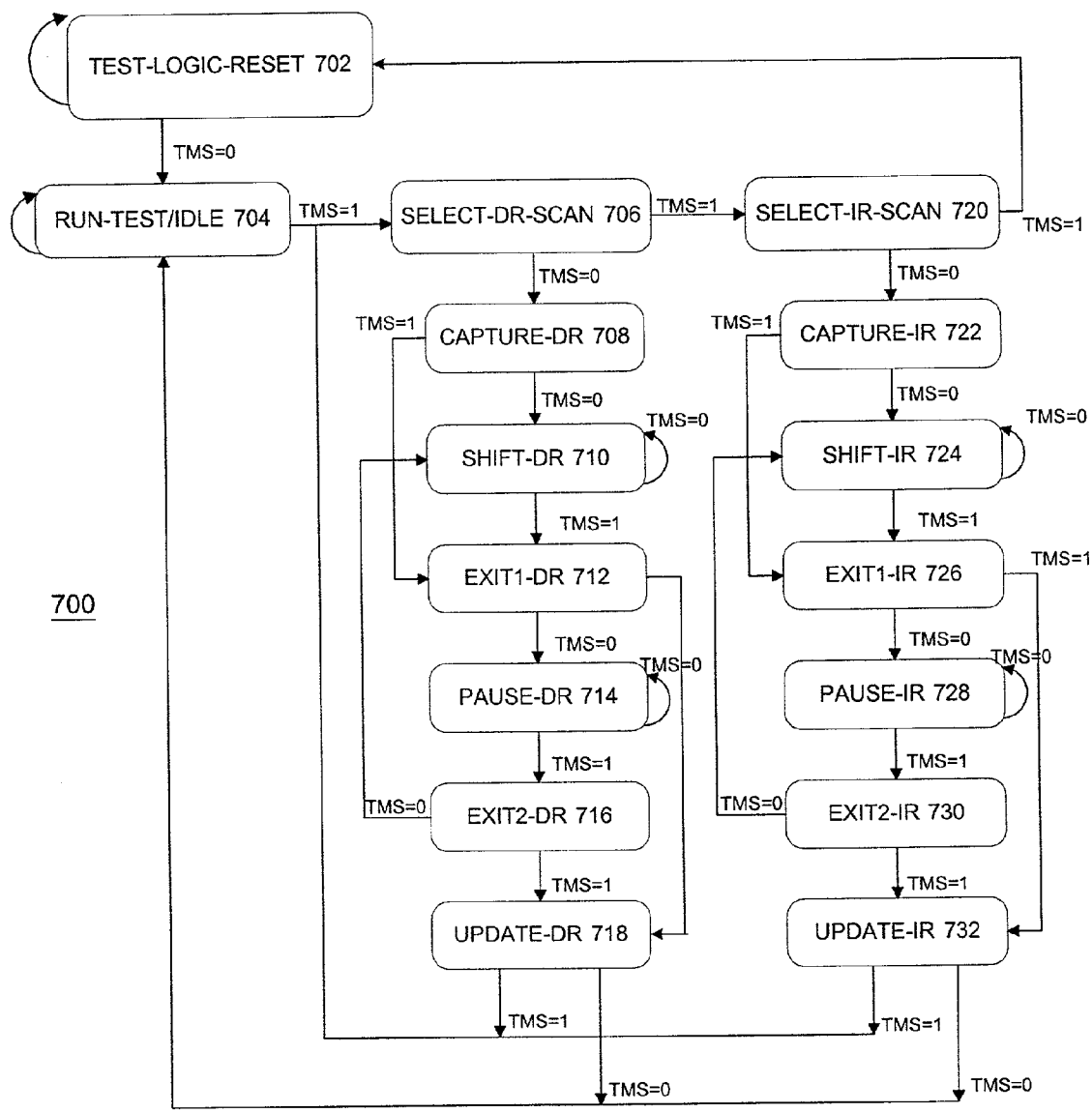
FIG. 4 is a state diagram showing exemplary operational states of a JTAG device.

The TMS signal determines the sequence of progress through a state machine contained in the device with which the JTAG master 404 is communicating (see FIG. 4). The state sequence is determined by the state of the TMS pin on the rising edge of TCK. For devices in the scan chain, TMS has an internal resistive pull-up to provide logic high if the pin is not driven. The operation of the state machine, which is required for compliance with the JTAG standard, is fully described below with reference to FIG. 4.

The TCK signal is the JTAG test clock. It sequences the operation of the JTAG master 404 and the JTAG registers in the devices connected to the JTAG interface 406.

On each slave device, the TDI signal is the serial input to all JTAG instruction and data registers. The state of the TAP controller and the current instruction held in the instruction register of the slave device determines which register the TDI pin is read into for a specific operation. In the exemplary embodiment shown, TDI has an internal resistive pull-up to provide logic high to the system if the pin is not driven. TDI is applied into the JTAG registers on the rising edge of TCLK.

The TDO pin is the serial output for all JTAG instruction and data registers. The state of the JTAG master 404 and the current instruction held in the instruction register determine which register (INSTRUCTION register or DATA register) is read into TDO for a specific operation. TDO changes state on the falling edge of TCK and is only active during the shifting of instructions or data through the device.

In addition to the four signals identified in Table 1, the JTAG standard recognizes several optional signals, such as TRST and a variety of enable signals, which may be implemented in devices from various manufacturers. In addition to the signals set forth in Table 1, the TRST signal is implemented in the exemplary embodiment of the JTAG interface 406. Those of ordinary skill in the art will appreciate that additional optional signals may have to be implemented to allow communication with the devices of some manufacturers, depending on which functions have been implemented in the device.

Any device with which the JTAG master 404 communicates with must implement several registers to facilitate its operation in accordance with the JTAG specification. One such register is the INSTRUCTION register ("IR"), which typically comprises eight bits, is connected between TDI and TDO during an instruction scan sequence. In preparation for an instruction scan sequence, the INSTRUCTION register is parallel loaded with a fixed instruction capture pattern. This pattern is shifted out onto TDO (LSB first) while an instruction is shifted into the INSTRUCTION register from TDI.

Devices connected to the JTAG master 404 may include one or more BYPASS registers. The BYPASS registers allow the selected device to be removed from the JTAG chain.

Devices connected to the JTAG master 404 may also include a BOUNDARY-SCAN register. The boundary-scan register may be used to control and observe the state of device pins during the EXTEST, SAMPLE/PRELOAD, and CLAMP instructions.

Devices that support JTAG testing may include an IDCODE, which is a fixed, vendor-assigned value that is used to electrically identify the manufacturer and type of the device being addressed. The IDCODE is typically stored in a 32-bit IDCODE register. The IDCODE register can be shifted out for examination by the JTAG master 404 using the IDCODE instruction.

The IDCODE register has the following binary format:

vvvv:ffff:ffff:aaaa:aaaa:cccc:cccc:ccc1 where
    v=the die version number
    f=the family code (for example, 50 h for XC18V00 family)
    a=the ISP PROM product ID (for example, 06 h for the XC18V04)
    c=the company code (for example, 49 h for Xilinx).

The LSB of the IDCODE register is always read as logic 1 as defined by the JTAG standard.

The USERCODE instruction may be executed by the JTAG master 404 to gain access to a 32-bit user programmable scratch pad typically implemented in JTAG compliant devices. The USERCODE instruction shifts out the data from a USERCODE register in a device connected to the JTAG master 404. The USERCODE register typically contains information about the programmed contents of the device. If the device connected to the JTAG master 404 is blank or not loaded during programming, the USERCODE register will typically contain a value of FFFFFFFFh.

Another register that may be accessed by the JTAG master 404 in many devices is the USER register, which is similar to the IDENTIFICATION register. Instead of containing device identification information, the USER REGISTER contains information that can change based upon status, upgrade levels, or other identification details that are programmed into the device.

In the exemplary embodiment, the JTAG master 404 supports a variety of system configurations and JTAG chain devices without the need to undergo frequent firmware revisions. There are two main approaches that facilitate this functionality. The first is for the JTAG master 404 to perform auto-enumeration of the JTAG chain and the second is for the JTAG master 404 to be provided with a description of the chain and it's components from an external source.

With respect to auto-enumeration, the JTAG chain is of unknown size and can contain unknown parts in and unknown order. It is nonetheless possible to determine the length of the scan chain. A very long pattern of logic highs (1s) can be fed into the chain. After that, an identifiable pattern (for example, logic lows (0s)) may be will fed into the chain. The length of the chain can be determined by counting the number of logic highs (1s) that scan out before the identifiable pattern is found.

The auto-enumeration approach has known shortcomings because detailed information about the components in the scan chain and even the order of components is difficult to determine. Different manufacturers do not all use the same bit pattern for the IDCODE instruction, which complicates the process of identifying each device in the scan chain.

Providing external data about the constituency of the scan chain to the JTAG master 404 is a more flexible approach than auto-enumeration. The information provided to the JTAG master 404 could include the device order and device information for each device on the chain. Particular information regarding the various register sizes could also be provided. The following example code could be used to provide scan chain information to the JTAG master 404:

```
struct JTAG_DESCRIPTOR_TAG {
    char name[20];
    unsigned int Identification;
    unsigned int IRLength;
    unsigned int BoundaryLength;
};
```

Additionally, the specific bit patterns required to perform various instructions could be provided:

```
#define BYPASS    0x00
#define IDCODE    0x01
```

-continued

```
#define USERCODE  0x02
#define ERASE     0x03
#define PROGRAM   0x04
struct JTAG_COMMANDS {
    unsigned short command;
    unsigned short length;
        // low N bits of bitPattern
    unsigned long bitPattern;
        // supports 32 bit instructions
};
```

The device-specific information in the format shown in the example software above could be stored in the system ROM of the managed server 20 (FIG. 1). If the information cannot be stored in system ROM, it could be made available from an external source (TCP/IP, FTP, WWW) and may be downloaded to the IOP 302 as required. Either of these alternatives helps to minimize changes to the firmware of IOP 302 that system layout or component changes would otherwise require.

In the exemplary embodiment, the IOP 302 (FIG. 2) obtains description information by requesting it from the managed server 20 (FIG. 1). Alternatively, the managed server 20 (FIG. 1) can push the information to the IOP 302 (FIG. 2) early in its operation. As another alternative, the JTAG master 404 may obtain a device code for the managed server 20 from one of the constituent devices in the scan chain. That device code may be used to identify and obtain data about other devices in the scan chain from an external source.

A software abstraction method provides another way to further minimize the necessity of revising the firmware of the IOP 302. Such a software abstraction method allows separation between programming that is device-specific and the JTAG master software. At the lowest abstraction level, the TMS, TCK, TDI, and TDO signals comprise the hardware level of the JTAG protocol. All communication or programming resolves to operations with these signals. JAM and SVF file formats for programming exist at a higher level of abstraction. Many popular JTAG programming software packages can export files in SVF format. Some programs support the export of JAM ASCII files (.jam) and JAM byte codes (.jbi).

By providing an architecture with software levels of abstraction, the IOP 302 (FIG. 2) can implement a small JTAG master driver without requiring the necessity of programming the JTAG master 404 to understand different integrated circuits in the scan chain and their programming algorithms. The information necessary to program different components could be provided to the driver from an external source.

In the exemplary embodiment, the IOP 302 (FIG. 2) is capable of processing XSVF files. The logic and code required to support this protocol is very small and does not require extensive processing power.

The XSVF file format is a compressed or tokenized version of the SVF file format, which is well-known in the field. SVF files are specific for the chain and device that are being programmed. While one device is programmed via an SVF file, the devices in the scan chain are held in the BYPASS or the HIGHZ state.

Those of ordinary skill in the art will appreciate that SVF files must be generated using many details of the JTAG scan-chain topology for the specific environment. Thus, different SVF files may be needed for managed servers having differing JTAG scan chain topologies. Further, the JTAG instructions in a given SVF file should take into account the necessary bit shifts and BYPASS values that are passed to all devices in a specific chain.

Some applications of the embodiment require dynamic generation of JTAG scan commands. An example of such an application is remote debugging of a complex device such as a microprocessor using the JTAG master 404 to perform embedded ICE functionality. The IOP 302 may be programmed with firmware that allows it to create ICE commands in response to user input from a remote management console. For example, the remote user may send commands indicating an action for the device being debugged to perform. Those of ordinary skill in the art will appreciate that the JTAG master 404 may be employed by a user to remotely perform any function that could otherwise be performed using a local ICE interface. Those functions include halting a microprocessor, restarting the microprocessor, displaying or modifying internal registers inside the microprocessor, issuing bus commands (for example, to read and write to system memory), setting breakpoints and the like.

The IOP firmware may be programmed to translate those commands into ICE commands communicated through the JTAG master 404. This methodology may be used to gain access to information from devices that do not have JTAG functionality if those devices are connected to JTAG devices in the scan chain. For example, a user could request the microprocessor of the managed server to issue a read or write command to a directly or indirectly coupled device, such as system memory. This capability greatly enhances the capabilities of the remote server management controller and does so in a manner that is independent of the OS of the managed server.

Those of ordinary skill in the art will appreciate that the JTAG protocol functions correctly in DC timing, which means that the clock frequency is variable. This is true because the presence of leading and falling edges of TCK causes data capture or events regardless of whether TCK is repetitive. Additionally, the maximum clock frequency of TCK will be restricted by the lowest maximum frequency for a specific device in the JTAG scan chain.

Additional timing considerations should be considered to allow for sufficient setup and hold times for signals in relation to the TCK signal. As will be apparent to those of ordinary skill in the field, those considerations may vary from device to device. The synchronous instructions of setting appropriate TDI and/or TMS signals in a single LOAD instruction, and then setting the appropriate TCK bit in a second LOAD instruction will ensure appropriate setup times. A third LOAD instruction will similarly ensure the required hold times.

FIG. 4 is a state diagram showing operational states of a JTAG device that may be connected to the JTAG master 404. The operational states set forth in FIG. 4 are specified in the JTAG standard. In FIG. 4, the state diagram is referred to generally by the reference numeral 700. The state machine required by the JTAG standard is a 16-state finite state machine. Each JTAG compliant device typically has the necessary registers (including at least one data register and at least one instruction register) and signal latching mechanisms to perform boundary-scan verification and to allow communication with the JTAG master 404.

One function of the state machine is to control how data is scanned into the INSTRUCTION register (IR) and DATA register (DR). The state of the TMS signal (Table 1) at the rising edge of the TCK signal (Table 1) determines the sequence of state transitions. The "0s" and "1s" shown in FIG. 4 indicate the transitions of the state machine of a device connected to the JTAG master 404 based on whether the TMS signal is a logic high (1) or a logic low (0).

The state machine is initialized by entering a test-logic-reset state 702. After that, a run-test/idle state 704 is entered upon clocking a logic low (0) on the TMS signal. As shown in FIG. 4, there are two main state sequences: one for shifting data into the DATA register ("DR") and the other for shifting an instruction into the INSTRUCTION register ("IR").

After the state machine is in the run-test/idle state 704, a select-DR-scan state 706 is initiated by asserting a logic high (1) on the TMS signal for one clock cycle only. A select-IR-scan state 720 is initiated by asserting a logic high (1) on the TMS signal for two clock cycles.

If the select-DR-scan 706 is initiated, the state machine may enter a capture-DR state 708, a shift-DR-state 710, an exit1-DR state 712, a pause-DR state 714, an exit2-DR state 716 and an update-DR state 718 by asserting the appropriate logic levels shown in FIG. 4 on the TMS signal. If the select-IR-scan state 720 is initiated, the state machine may enter a capture-IR state 722, a shift-IR state 724, an exit1-IR state 726, a pause-IR state 728, an exit2-IR state 730 and an update-IR state 732 by asserting the appropriate logic level shown in FIG. 4 on the TMS signal.

Those of ordinary skill in the art will appreciate that the JTAG master 404 adds powerful analysis, management and control capability to the remote server management controller 200 (FIG. 2). As a subsystem of the remote server management controller 200 (FIG. 2), the JTAG master 404 may be addressed remotely (for example, from a remote management site) to maximize its potential usefulness. The following paragraphs give a few examples of the enhanced functionality that the JTAG master 404 brings to the field of remote server management:

EXAMPLE 1

Obtaining Management Information From a Connected Device

The boundary scan testing functionality of the JTAG specification allows a JTAG master 404 to obtain a snapshot the status of any of the external pins of a connected device without impacting the operation of the device. For devices that do not have any out-of-band management connections, the JTAG master 404 could be used to obtain this information while the managed server containing the JTAG master 404 is operational.

EXAMPLE 2

Controlling/Commanding a Connected Device

Many devices in a managed server do not typically provide out-of-band management signals. Embedded RAID controllers typically fall into that category. Accordingly, such devices cannot be managed using out-of-band methods. The JTAG master 404, however, may be used to address and control an embedded RAID controller through its JTAG inputs, even if the RAID controller does not otherwise support out-of-band management. This means that a user would have the ability to configure a RAID array and even format the drives remotely via the remote server management controller 200 (FIG. 2).

EXAMPLE 3

Performing Simple and Complex Boundary-Scan Testing

The boundary-scan test functionality of the JTAG chain was initially designed to allow in-circuit testing of component connections. This capability has powerful applications that may be utilized by the JTAG master 404 to diagnose component failures in a completed server.

A managed server could be configured to employ the JTAG master 404 to perform a boundary scan as part of an initial power-on process. Such a boundary scan could quickly detect many problems that might otherwise cause a customer to return the server or have to initiate a lengthy and expensive diagnostic process. The initial boundary scan could readily detect if a device in the scan chain (for example, the system ROM) became disconnected during transport or otherwise broken. The results of the initial boundary-scan could be displayed to a user through a wide variety of methods. Two examples of how the results could be displayed are (1) through an application running on a remote management console ( such as a standard web browser) or (2) through a local display (such as an LCD display on the front of the managed server).

The JTAG master 404 may additionally be employed to execute more complex boundary-scan functions to identify a wider range of failures within the managed server. The boundary-scan test functionality of the JTAG chain allows test vectors to be processed to verify connectivity, interconnectivity, and correct operation of any device in the scan chain. The IOP 302 (FIG. 2) could be programmed to execute these tests after manufacture, during POST, and upon demand in order to verify correct operation and test for possible errors.

A broken trace between the auxiliary voltage signal ($V_{aux}$) on the motherboard of the server and its power button is an example of a problem that could be diagnosed using test vectors. This problem could be reported to a user in the same ways described above.

EXAMPLE 4

In-Field Upgrading/Programming of CPLDs or ROMs

The JTAG master 404 can be used to program or update the programming of JTAG-compatible devices in the managed server 20 (FIG. 1) remotely and without the need for an on-site service call. The IOP 302 may be programmed to have the capability to download updated device code, program the appropriate device in the scan chain using the JTAG master 404 and then reset the device. The updated device programming may provide improved system performance, remedy a design bug or provide new features for the managed server.

EXAMPLE 5

Providing ITP Access and/or ICE Access

As described above, ITP and ICE are test methodologies promulgated by Intel Corporation. The exemplary embodiment of the JTAG master 404 implements the additional signals that support ITP. The ITP/ICE methodologies provide deep failure analysis and debugging capability for compliant devices.

In the exemplary embodiment of the invention, the IOP 302 is capable of acting as an ITP/ICE device to facilitate full hardware debugging. The remote capability of the remote server management controller 200 (FIG. 2) allows ITP/ICE debugging using the IOP 302 (FIG. 2) and the JTAG master 404 from a remote location, such as a remote management facility.

EXAMPLE 6

Commanding Devices While Managed Server is Online

The JTAG master 404 gives a user the capability to command and control devices in the managed server even while the managed server is online. The JTAG controller may be used to issue requests through devices in the scan chain. These requests may be queued and executed along with requests made as part of the normal operation of the managed server. This capability allows the user to test the operational communication paths between various devices in the managed server without taking the managed server offline or placing it in a test mode. Communication paths that may not otherwise be subject to regular testing may be tested periodically using this methodology.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A remote server management controller disposed in a managed server, the remote server management controller comprising:
    an IOP;
    an embedded JTAG master that is controllable by the IOP, the embedded JTAG master having a JTAG interface; and
    at least one integrated circuit disposed in the managed server and connected for operative communication to the JTAG interface, wherein the at least one integrated circuit comprises a microprocessor, and
    wherein the JTAG master is configured to be accessed remotely through the remote server management controller to provide communication between a remote computer and the at least one integrated circuit via the JTAG interface by way of the JTAG master.

2. The remote server management controller of claim 1 wherein the JTAG interface comprises an ITP interface that uses an ITP testing methodology.

3. The remote server management controller of claim 1 wherein the JTAG interface comprises an ICE interface that uses an ICE testing methodology.

4. The remote server management controller of claim 1 wherein the at least one integrated circuit comprises a component of a chipset.

5. The remote server management controller of claim 1 wherein the JTAG master is configured to program the at least one integrated circuit.

6. The remote server management controller of claim 1 wherein the IOP is configured to be programmed to control the JTAG master to perform an initial test of the at least one integrated circuit when the managed server is initially powered up.

7. The remote server management controller of claim 1 wherein the IOP is programmed with descriptive data about the at least one integrated circuit.

8. A managed server, comprising:
a motherboard having at least one integrated circuit disposed thereon;
a remote server management controller in operable communication with the managed server, the remote server management controller comprising:
an IOP; and
an embedded JTAG master that is controllable by the IOP, the embedded JTAG master having a JTAG interface, the at least one integrated circuit connected for operative communication to the JTAG interface, wherein the at least one integrated circuit comprises a microprocessor, and,
wherein the JTAG master is configured to be accessed remotely through the remote server management controller to provide communication between a remote computer and the at least one integrated circuit via the JTAG interface by way of the JTAG master.

9. The managed server of claim 8 wherein the JTAG interface comprises an ITP interface that uses an ITP testing methodology.

10. The managed server of claim 8 wherein the JTAG master is configured to program the at least one integrated circuit.

11. The managed server of claim 8 wherein the at least one integrated circuit comprises a component of a chipset.

12. The managed server of claim 8 wherein the IOP is configured to be programmed to control the JTAG master to perform an initial test of the at least one integrated circuit when the managed server is initially powered up.

13. The managed server of claim 8 wherein the IOP is programmed with descriptive data about the at least one integrated circuit.

14. A method of communicating with an integrated circuit in a managed server, the managed server having a remote server management controller in operative communication therewith, the remote server management controller having an IOP and a JTAG master disposed thereon for operative communication with each other, the JTAG master having a JTAG interface connected for operative communication to the integrated circuit, the method comprising the acts of:
receiving data at the IOP of the remote server management controller;
transmitting the data from the IOP to the JTAG master; and
transmitting the data from the JTAG master to the integrated circuit via the JTAG interface, wherein the integrated circuit comprises a microprocessor.

15. The method of claim 14, further comprising the act of programming the IOP to control the JTAG master to perform a boundary scan of the integrated circuit when the managed server is turned on.

16. The method of claim 14 further comprising the act of programming the IOP with descriptive data about the integrated circuit.

17. The method of claim 14 further comprising the act of programming the integrated circuit.

18. The method of claim 14 wherein the recited acts are performed preformed in the recited order.

19. A method of using a computer comprising:
connecting a computer to a remote server management controller disposed in a managed server; and
communicating by way of a JTAG master with an integrated circuit disposed in the managed server via a JTAG interface associated with the remote server management controller, wherein the integrated circuit comprises a microprocessor.

20. The method, as set forth in claim 19, wherein communicating with the integrated circuit is controlled by an IOP.

21. A method of manufacturing a computer comprising:
disposing a remote server management controller in a server, the remote server management controller comprising:
an IOP;
an embedded JTAG master that is controllable by the IOP, the embedded JTAG master having a JTAG interface; and
an integrated circuit disposed in the managed server and connected for operative communication to the JTAG interface, wherein the integrated circuit comprises a microprocessor, and
wherein the JTAG master is configured to be accessed remotely through the remote server management controller to provide communication between a client computer and the integrated circuit via the JTAG interface by way of the JTAG master.

22. The method, as set forth in claim 21, wherein the integrated circuit is located on a motherboard.

* * * * *

UNITED STATES PATENT AND TRADEMARK OFFICE
CERTIFICATE OF CORRECTION

PATENT NO. : 7,047,462 B2
APPLICATION NO. : 10/037541
DATED : May 16, 2006
INVENTOR(S) : Andrew Brown et al.

It is certified that error appears in the above-identified patent and that said Letters Patent is hereby corrected as shown below:

On the Title page, in Item (73), in "Assignee", in column 1, line 2, delete "LP.," and insert -- L.P., --, therefor.

In column 1, line 67, delete "Modem" and insert -- Modern --, therefor.

In column 3, line 32, delete "modem" and insert -- modern --, therefor.

Signed and Sealed this

Seventeenth Day of March, 2009

JOHN DOLL
*Acting Director of the United States Patent and Trademark Office*